(12) United States Patent
Jung et al.

(10) Patent No.: US 8,975,665 B2
(45) Date of Patent: Mar. 10, 2015

(54) INTEGRATED CIRCUIT PACKAGING SYSTEM WITH CORELESS SUBSTRATE AND METHOD OF MANUFACTURE THEREOF

(71) Applicants: JinHee Jung, Busan (KR); YoungDal Roh, Icheon-si (KR); KyoungHee Park, Icheon-si (KR)

(72) Inventors: JinHee Jung, Busan (KR); YoungDal Roh, Icheon-si (KR); KyoungHee Park, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/742,580

(22) Filed: Jan. 16, 2013

(65) Prior Publication Data

US 2014/0097475 A1    Apr. 10, 2014

Related U.S. Application Data

(60) Provisional application No. 61/711,975, filed on Oct. 10, 2012.

(51) Int. Cl.
*H01L 23/52* (2006.01)
*H01L 23/535* (2006.01)
*H01L 21/768* (2006.01)
*H01L 23/498* (2006.01)

(52) U.S. Cl.
CPC ............ *H01L 23/535* (2013.01); *H01L 21/768* (2013.01); *H01L 23/49816* (2013.01); *H01L 23/49827* (2013.01); *H01L 2224/16225* (2013.01); *H01L 2224/32225* (2013.01); *H01L 2224/73204* (2013.01); *H01L 2924/15311* (2013.01)
USPC ............ 257/211; 257/758; 257/759; 257/774

(58) Field of Classification Search
CPC ............ H01L 23/5286; H01L 23/5283; H01L 23/5226; H01L 2224/023
USPC .................... 257/211, 758, 759, 774; 438/124
See application file for complete search history.

(56) References Cited

U.S. PATENT DOCUMENTS

| | | | |
|---|---|---|---|
| 7,320,173 | B2 | 1/2008 | Lee et al. |
| 7,346,982 | B2 | 3/2008 | Kim et al. |
| 2006/0278991 | A1* | 12/2006 | Kwon et al. ............... 257/777 |
| 2008/0012140 | A1* | 1/2008 | Tsukano et al. ............ 257/758 |
| 2008/0115355 | A1 | 5/2008 | Park et al. |
| 2008/0157330 | A1* | 7/2008 | Kroehnert et al. ............ 257/686 |
| 2008/0264684 | A1 | 10/2008 | Kang et al. |
| 2008/0277783 | A1* | 11/2008 | Kim et al. ............... 257/737 |

(Continued)

OTHER PUBLICATIONS

U.S. Appl. No. 13/425,768, filed Mar. 21, 2012, Jeon et al.

*Primary Examiner* — Tan N Tran
(74) *Attorney, Agent, or Firm* — Ishimaru & Associates LLP (57) ABSTRACT

A method of manufacture of an integrated circuit packaging system includes: forming a first metal layer on a carrier; forming an insulation layer directly on the first metal layer; exposing a portion of the first metal layer for directly attaching to a die interconnect connecting to an integrated circuit; forming a second metal layer directly on the insulation layer opposite the side of the insulation layer exposed by removing the carrier; and forming a protective layer directly on the insulation layer and the second metal layer, the protective layer exposing a portion of the second metal layer for directly attaching an external interconnect.

20 Claims, 5 Drawing Sheets

(56) References Cited

U.S. PATENT DOCUMENTS

| | | |
|---|---|---|
| 2009/0025210 A1 | 1/2009 | Lee et al. |
| 2009/0160053 A1* | 6/2009 | Meyer et al. .................. 257/738 |
| 2009/0321932 A1* | 12/2009 | Gonzalez et al. ............. 257/750 |
| 2011/0084370 A1 | 4/2011 | Su et al. |
| 2011/0169150 A1 | 7/2011 | Su et al. |
| 2011/0186342 A1 | 8/2011 | Kim et al. |
| 2012/0055698 A1 | 3/2012 | Won et al. |
| 2014/0008814 A1 | 1/2014 | Chen et al. |

* cited by examiner

INTEGRATED CIRCUIT PACKAGING SYSTEM WITH CORELESS SUBSTRATE AND METHOD OF MANUFACTURE THEREOF

CROSS-REFERENCE TO RELATED APPLICATION

The present application claims the benefit of U.S. Provisional Patent Application Ser. No. 61/711,975 filed Oct. 10, 2012 and the subject matter thereof is incorporated herein by reference in its entirety.

TECHNICAL FIELD

The present invention relates generally to an integrated circuit packaging system, and more particularly to a system for an integrated circuit packaging system with a coreless substrate.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, handsfree cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a first metal layer on a carrier; forming an insulation layer directly on the first metal layer; exposing a portion of the first metal layer for directly attaching to a die interconnect connecting to an integrated circuit; forming a second metal layer directly on the insulation layer opposite the side of the insulation layer exposed by removing the carrier; and forming a protective layer directly on the insulation layer and the second metal layer, the protective layer exposing a portion of the second metal layer for directly attaching an external interconnect.

The present invention provides an integrated circuit packaging system, including: a one-layer substrate includes: a first metal layer for directly attaching to a die interconnect; an insulation layer directly on the first metal layer; a second metal layer directly on the insulation layer and opposite the exposed side of the first metal layer; and a protective layer directly on the insulation layer and the second metal layer, the protective layer exposing a portion of the second metal layer for directly attaching to an external interconnect.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
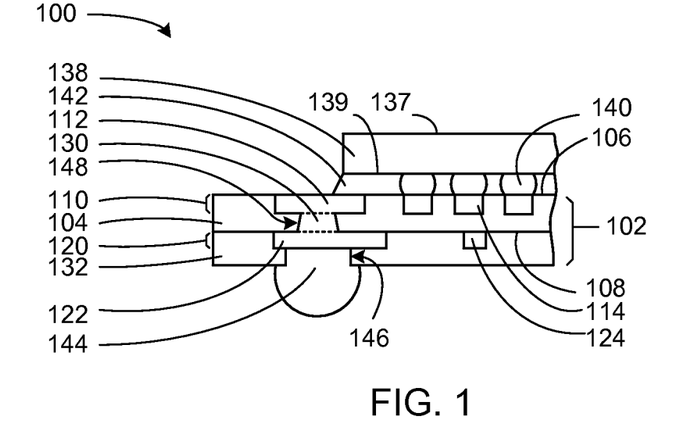
FIG. 1 is a cross-sectional view of a portion of an integrated circuit packaging system in an embodiment of the present invention.

Referring now to FIG. 1, therein is shown a cross-sectional view of a portion of an integrated circuit packaging system 100 in an embodiment of the present invention. The integrated circuit packaging system 100 represents a structure and a manufacturing method of a coreless substrate.

The integrated circuit packaging system 100 can include a coreless substrate 102. The coreless substrate 102 is defined as a two-layer support structure having a layer of insulation material and a layer of protective material. The layer of insulation material is for mounting and connecting a semiconductor device thereto including providing electrical connections through the support structure. The layer of protective material is for protecting the electrical connections extending from the layer of insulation material.

The coreless substrate 102 can include an insulation layer 104, which is defined as layer of insulation material providing electrical isolation and protection. The insulation layer 104 can include an insulation layer component side 106 and an insulation layer system side 108. The insulation layer component side 106 is defined as the side of the insulation layer 104 where components can be attached. The insulation layer system side 108 is the side opposite the insulation layer component side 106.

The insulation layer 104 can be formed from an electrically insulating material. The insulation layer 104 can be a fiber fabric pre-impregnated with resin (PPG), insulation film, insulating resin, polymer, or a combination thereof.

The coreless substrate 102 can include a first metal layer 110 within the insulation layer 104. The first metal layer 110 is defined as electrically conductive elements within the insulation layer 104. The first metal layer 110 can be formed from an electrically conductive material such as metal, metal alloy, or a combination thereof. The first metal layer 110 can conduct electrical signals between different locations on the insulation layer component side 106.

The first metal layer 110 can include component attachment pads 112, which are defined as conductive elements exposed on the insulation layer component side 106. The component attachment pads 112 can be formed from an electrically conductive material such as metal, metal alloy, or a combination thereof. A portion of the first metal layer 110 can be exposed from the insulation layer 104. The exposed portion of the first metal layer 110 is coplanar with an exposed portion of the insulation layer 104.

The first metal layer 110 can include a first redistribution layer 114, which is defined as conductive elements on the insulation layer component side 106 for forming electrical connections between components and external systems. The first redistribution layer 114 can be formed from an electrically conductive material such as metal, metal alloy, or a combination thereof. The component attachment pads 112 and the first redistribution layer 114 are exposed from and coplanar with the insulation layer component side 106.

The coreless substrate 102 can include a second metal layer 120, which is defined as electrically conductive elements. The second metal layer 120 can be formed directly on the insulation layer 104 on the side of the insulation layer 104 opposite from the side the first metal layer 110 is exposed. The second metal layer 120 can be formed from an electrically conductive material such as metal, metal alloy, or a combination thereof.

The second metal layer 120 can include system attachment pads 122, which are defined as electrically conductive elements on the insulation layer system side 108. The system attachment pads 122 can be formed from an electrically conductive material such as metal, metal alloy, or a combination thereof.

The second metal layer 120 can include a second redistribution layer 124, which is defined as electrically conductive elements. The second redistribution layer 124 can be formed from an electrically conductive material such as metal, metal alloy, or a combination thereof. The second redistribution layer 124 is directly on the insulation layer 104.

The coreless substrate 102 can include vertical interconnects 130, which are defined as an electrically conductive elements forming electrical connections between the component attachment pads 112 and the system attachment pads 122. The vertical interconnects 130, the component attachment pads 112, and the system attachment pads 122 can form an electrical connection between the insulation layer component side 106 and the insulation layer system side 108.

The vertical interconnects 130 can be formed within vertical openings 148 in the insulation layer 104 that expose a portion of the component attachment pads 112. The vertical interconnects 130 can have a diameter smaller than the diameters of the component attachment pads 112 and the system attachment pads 122.

The coreless substrate 102 can include a protective layer 132, which is defined as a layer formed from a protective material. The protective layer 132 can provide electrical insulation and form a mechanically protective barrier. The protective layer 132 can be formed directly on the insulation layer 104, the system attachment pads 122, and the insulation layer 104 with no intervening elements. The protective layer 132 can be a solder resist (SR) material, an epoxy, a polymer coating, or a combination thereof.

The protective layer 132 can include external openings 146, which are holes in the protective layer 132 that can expose portions of the system attachment pads 122. The external opening 146 expose the system attachment pads 122 to allow the formation of electrical connections to external systems (not shown).

The integrated circuit packaging system 100 can include an integrated circuit 138, which is defined as a device having active circuitry fabricated thereon. The integrated circuit 138 can include an active side 137 and a system side 139. The system side 139 is the side of the integrated circuit 138 having connectors for attachment to an external system (not shown). The active side 137 is the side opposite the system side 139.

The integrated circuit 138 can be connected to the coreless substrate 102 with die interconnects 140. The die interconnects 140 are defined as electrically conductive elements for forming electrical connections to an integrated circuit die. The die interconnects 140 can connect the system side 139 of the integrated circuit 138 to the first metal layer 110 including the component attachment pads 112 and the first redistribution layer 114.

The die interconnects 140 can be attached directly on the integrated circuit 138 and the attachment pads, such as the component attachment pads 112, the first redistribution layer 114, or a combination thereof. The die interconnects 140 can be solder balls, solder bumps, bond wires, or a combination thereof.

The integrated circuit packaging system 100 can include an adhesive layer 142, which is a layer for bonding material between the integrated circuit 138 and the insulation layer 104. The adhesive layer 142 can be directly on the integrated circuit 138, the die interconnects 140, the insulation layer 104, the component attachment pads 112, and the first redistribution layer 114. The adhesive layer 142 can be formed from an epoxy, a polymer compound, an underfill material, or a combination thereof.

The integrated circuit packaging system 100 can include external interconnects 144, which are defined as conductive elements for forming electrical connections to external systems (not shown). The external interconnects 144 can be solder balls, solder bumps, solder posts, bond wires, or a combination thereof.

The external interconnects 144 can be attached to the system attachment pads 122 exposed in the external openings 146. The integrated circuit 138 can be electrically connected to the external interconnects 144 via the die interconnects 140, the first metal layer 110, the component attachment pads 112, the vertical interconnects 130, the second metal layer 120, the system attachment pads 122, the second redistribution layer 124, or a combination thereof.

The integrated circuit packaging system 100 can include an encapsulant (not shown), which is defined as a package cover of a semiconductor package to hermetically seal the integrated circuit as well as providing mechanical and environmental protection. The encapsulant can be formed directly on and over the integrated circuit 138, the adhesive layer 142, the coreless substrate 102, and the component attachment pads 112.

It has been discovered that the coreless substrate 102 having the insulation layer 104 and the protective layer 132 provides improved reliability by reducing the likelihood of warpage. Forming the coreless substrate 102 with only two layers simplifies fabrication and reduces potential warpage defects by reducing the number of components and layers involved in manufacture.

It has been discovered that the coreless substrate 102 having the insulation layer 104 and the protective layer 132 provides simplified manufacturing, increased reliability, and reduced costs by utilizing the insulator layer formed with PPG. Because the coreless substrate has only two layers, forming the insulator layer requires fewer manufacturing steps. Because PPG material is lower cost than core materials, using the less expensive, alternative PPG material for forming the insulator layer reduces costs.

It has been discovered the forming the coreless substrate 102 having the protective layer 132 directly on the insulation layer 104 provides simplified manufacturing and increased reliability by minimizing the number of layers of the coreless substrate 102 to reduce the possibility of delamination between layers. Forming the protective layer 132 directly on the insulation layer 104 and the second metal layer 120 forms a mold lock that reduces the potential for relative motion between the layers and reduces the likelihood of defects due to mechanical stress.

Figure 2:
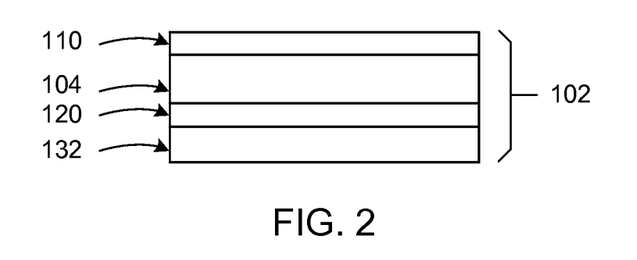
FIG. 2 is an exemplary side-view of the coreless substrate.

Referring now to FIG. 2, therein is shown an exemplary side view of the coreless substrate 102. The coreless substrate 102 can include the first metal layer 110, the insulation layer 104, the second metal layer 120, and the protective layer 132.

The first metal layer 110 is directly on and over the insulation layer 104. The first metal layer 110 can also be embedded within the insulation layer 104.

The insulation layer 104 is directly on and over the second metal layer 120. The insulation layer 104 is between the first metal layer 110 and the second metal layer 120. The second metal layer 120 is directly on and over the protective layer 132. The second metal layer can also be embedded within the protective layer 132.

Figure 3:
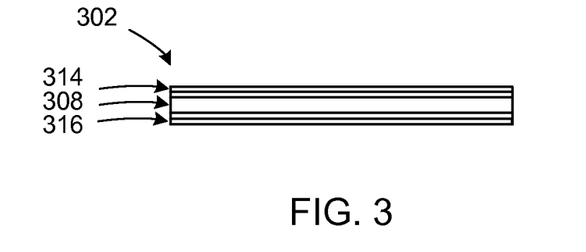
FIG. 3 is a cross-sectional view of a portion of the integrated circuit packaging system in a preparation phase of manufacture.

Referring now to FIG. 3, therein is shown a cross-sectional view of a portion of the integrated circuit packaging system 100 of FIG. 1 in a preparation phase of manufacture. The integrated circuit packaging system 100 can include a carrier 302 to provide a support structure for forming the coreless substrate 102 of FIG. 1. The carrier 302 can be formed from core material.

The carrier 302 can include an internal layer 308. The internal layer 308 can be formed from a variety of materials including a core material, epoxy, fiberglass, glass fabric, resin, a dielectric, insulation material, or a combination thereof. The terms first and second are used for identification purposes and do not imply any indication of importance, steps, order, or process.

The carrier 302 can include a top intermediate layer 314 attached directly to the internal layer 308. The internal layer 308 can include a bottom intermediate layer 316 attached directly to the internal layer 308.

The top intermediate layer 314 and the bottom intermediate layer 316 can be formed with a conductive material including metal, metal alloy, or a combination thereof. For example, the top intermediate layer 314 and the bottom intermediate layer 316 can be formed with copper (Cu) film, copper alloy, nickel, tin, or a combination thereof. In another example, the top intermediate layer 314 and the bottom intermediate layer 316 can be metal seed layers used to form metal patterns for circuits including the first redistribution layer 114 of FIG. 1, the component attachment pads 112 of FIG. 1, or a combination thereof.

The carrier 302 can be a laminated structure with multiple layers. Although the carrier 302 is described as having the internal layer 308, the top intermediate layer 314, and the bottom intermediate layer 316, it is understood that the carrier 302 can have additional layers such as additional insulation layers, protective layers, conductive layers, or a combination thereof.

It has been discovered that forming the carrier 302 using the internal layer 308, the top intermediate layer 314, and the bottom intermediate layer 316 can increase manufacturing yield and lower production time by supporting double-sided substrate manufacturing. By using a symmetric multi-layer structure for the carrier 302, both sides may be used to support the formation of the coreless substrate 102.

Figure 4:
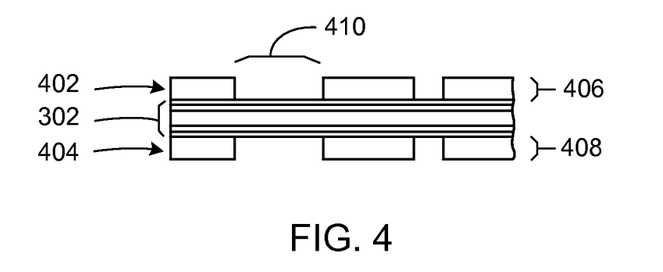
FIG. 4 is the structure of FIG. 3 in a laminating phase.

Referring now to FIG. 4, therein is shown the structure of FIG. 3 in a laminating phase. The laminating phase can include applying a photoresist top layer 402 and a photoresist bottom layer 404 directly on the carrier 302 and then removing portions of the photoresist top layer 402 and the photoresist bottom layer 404 to form a pattern top mask 406 and a pattern bottom mask 408, respectively.

The photoresist top layer 402 and the photoresist bottom layer 404 can be formed directly on opposite sides of the carrier 302. The photoresist top layer 402 and the photoresist bottom layer 404 are formed from a photosensitive material. The photosensitive material can be a photo-resistant material such as a photopolymer, resin, dry film, dry film laminate (DF laminate), or combination thereof.

The photoresist top layer 402 and the photoresist bottom layer 404 can be patterned to form first holes 410. For example, the photoresist top layer 402 and the photoresist bottom layer 404 can be exposed to ultraviolet light through a photomask (not shown) having a pattern representing the first holes 410. After patterning, the photoresist top layer 402 and the photoresist bottom layer 404 can be cured to set the photosensitive material and form the pattern top mask 406 and the pattern bottom mask 408 respectively.

The pattern top mask 406 and the pattern bottom mask 408 are defined as masking structures for forming the first metal layer 110 of FIG. 1. The first holes 410 can expose portions of the carrier 302 where the component attachment pads 112 of FIG. 1 and the first metal layer 110 can be formed.

It has been discovered that forming the pattern top mask 406 and the pattern bottom mask 408 provides higher metal line density. By forming fine mask lines in the pattern top mask 406 and the pattern bottom mask 408 using the photoresist material, the first metal layer 110, the component attachment pads 112, and the first redistribution layer 114 of FIG. 1 can be more precisely defined and formed providing higher metal line density.

Figure 5:
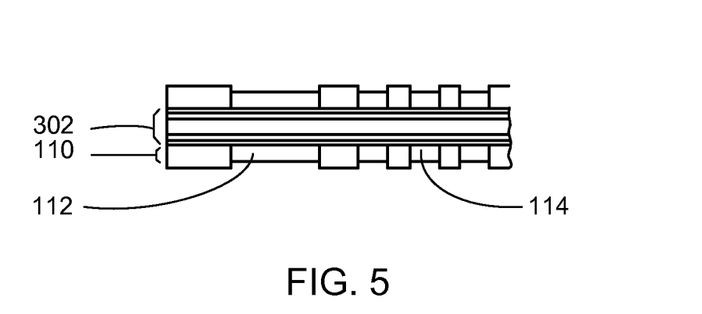
FIG. 5 is the structure of FIG. 4 in a plating phase.

Referring now to FIG. 5, therein is shown the structure of FIG. 4 in a plating phase. The plating phase can include plating the first metal layer 110 directly on the carrier 302 and within the first holes 410 of FIG. 4. Forming the first metal layer 110 can include forming the component attachment pads 112 and the first redistribution layer 114 in the first holes 410.

It has been discovered that forming the first metal layer 110 directly on the carrier 302 provides increased functionality and higher metal line density. Forming the first metal layer 110 on the carrier 302 allows finer metal lines to be precisely formed and creates a higher metal line density.

Figure 6:
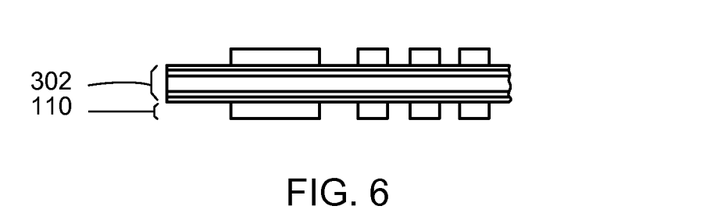
FIG. 6 is the structure of FIG. 5 in a stripping phase.

Referring now to FIG. 6, therein is shown the structure of FIG. 5 in a stripping phase. The stripping phase can include removing the photoresist top layer 402 of FIG. 4 and the photoresist bottom layer 404 of FIG. 4 from the carrier 302 to expose the first metal layer 110 directly on the carrier 302. The photoresist top layer 402 and the photoresist bottom layer 404 can be removed by etching, application of a solvent, grinding, or a combination thereof.

Figure 7:
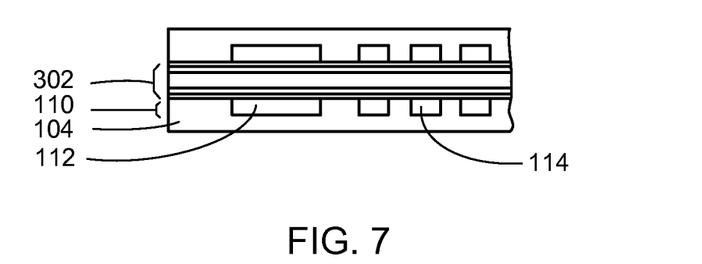
FIG. 7 is the structure of FIG. 6 in an insulation phase.

Referring now to FIG. 7, therein is shown the structure of FIG. 6 in an insulation phase. The insulation layer 104 can be formed directly on and over the first metal layer 110 and the carrier 302. The insulation layer 104 can encapsulate the carrier 302 and first metal layer 110 including the component attachment pads 112 and the first redistribution layer 114.

The insulation layer 104 can be formed between portions of the first metal layer 110. For example, the insulation layer 104 can be formed between a portion of the first redistribution layer 114 and another portion of the first redistribution layer 114.

The insulation layer 104 is formed from a dielectric material. For example, the insulation layer 104 can be formed by applying PPG material directly on the first metal layer 110 and the carrier 302. The use of a PPG material can simplify manufacture and reduce costs over using a core material.

It has been discovered that using the insulation layer 104 formed from PPG material provides simplified manufacturing by providing the rigidity and stability necessary for supporting the first redistribution layer 114 and the component attachment pads 112. The insulation layer 104 simplifies manufacturing by replacing a core layer and a solder resist layer.

It has been discovered that forming the insulation layer 104 formed from PPG material directly on and over the first metal layer 110 and the carrier 302 provides increased functionality and finer line density by providing an insulating support structure between adjacent portions of the first metal layer 110 using the PPG material. The portions of the first metal layer are mechanically supported by the PPG material of the insulation layer 104.

It has been discovered that forming the insulation layer 104 over the first redistribution layer 114 can provide simplified manufacturing by eliminating the need for an additional solder resist layer. Exposing the tops of the first redistribution layer 114 buried within the insulation layer 104 allows connectivity with the integrated circuit 138 of FIG. 1 while protecting the first redistribution layer 114 from unwanted short circuits.

Figure 8:
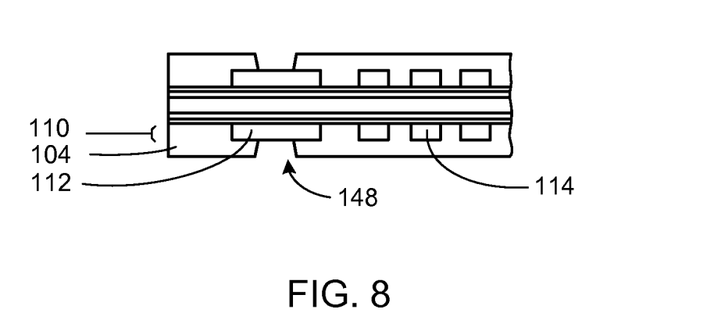
FIG. 8 is the structure of FIG. 7 in a drilling phase.

Referring now to FIG. 8, therein is shown the structure of FIG. 7 in a drilling phase. The drilling phase can include forming the vertical openings 148 in the insulation layer 104 to expose a portion of the first metal layer 110.

The vertical openings 148 can expose portions of the component attachment pads 112, the first redistribution layer 114, or a combination thereof. For example, the drilling phase can form the vertical openings 148 in a variety of ways including using a laser drill, etching, cutting, or a combination thereof. The vertical openings 148 can be used to form the vertical interconnects 130 of FIG. 1

The component attachment pads 112 and the vertical openings 148 can include physical features characteristic of the insulation layer 104 being removed. The physical features can include removal marks, scratches, or surfaces free of dishing. For example, the removal marks can include etched marks, scratch marks, rotary marks, or polished marks.

Figure 9:
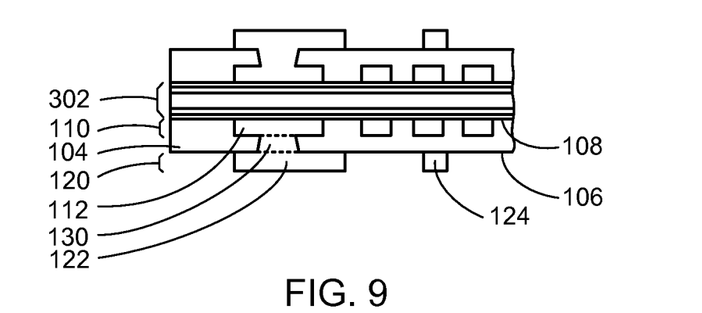
FIG. 9 is the structure of FIG. 8 in a patterning phase.

Referring now to FIG. 9, therein is shown the structure of FIG. 8 in a patterning phase. The patterning phase can include forming the second metal layer 120 directly on the insulation layer 104 and the component attachment pads 112 exposed within the vertical openings 148 of FIG. 1.

The second metal layer 120 can be formed by applying an electrically conductive layer directly on the insulation layer 104 and the vertical openings 148 and removing portions of the second metal layer 120 to form the system attachment pads 122 and the second redistribution layer 124. The second metal layer 120 is formed on the side of the insulation layer 104 facing away from the carrier 302 and the system attachment pads 122. The second metal layer 120 is formed on the side of the insulation layer 104 opposite the first metal layer 110.

The second metal layer 120 can be formed in a variety of ways. For example, the second metal layer 120 can be formed by sputtering, plating, depositing, or a combination thereof.

The second metal layer 120 can include the vertical interconnects 130. The vertical interconnects 130 can be formed by depositing the second metal layer 120 in the vertical openings 148 over the component attachment pads 112. The second metal layer 120 can include portions of varying thickness, such as a thicker layer of electrically conductive material formed in the vertical openings 148 to form the vertical interconnects 130.

The second metal layer 120 can include the system attachment pads 122 formed directly on the insulation layer 104 and overlapping with the vertical interconnects 130. The second metal layer 120 can include the second redistribution layer 124 formed directly on the insulation layer 104. For illustrative purposes, the vertical interconnects 130, the component attachment pads 112, and the system attachment pads 122 appears to be a single integral structure, although it is understood that the vertical interconnects 130, the component attachment pads 112, and the system attachment pads 122 can be formed with separate conductive layers.

The patterning phase can include removing a portion of the second metal layer 120 to form the system attachment pads 122 and the second redistribution layer 124. The portions of the second metal layer 120 can be removed by etching, grinding, laser cutting, or a combination thereof. For example, the second metal layer 120 can be etched with a second photomask (not shown) to remove the portions of the second metal layer 120 that are not the system attachment pads 122 and the second redistribution layer 124.

It has been discovered that forming the second metal layer 120 having the vertical interconnects 130 and the system attachment pads 122 directly on and connected to the system attachment pads 122 increases reliability and reduces package warping. The system attachment pads 122 and the system attachment pads 122 form an interlocking structure with the insulation layer 104 and prevents vertical and horizontal motion of the system attachment pads 122, the system attachment pads 122, and the vertical interconnects 130.

It has been discovered that forming the second metal layer 120 with different thickness can increase functionality by allowing the formation of the vertical interconnects 130 to provide a path for electrical conductance between the insulation layer component side 106 and the insulation layer system side 108.

Figure 10:
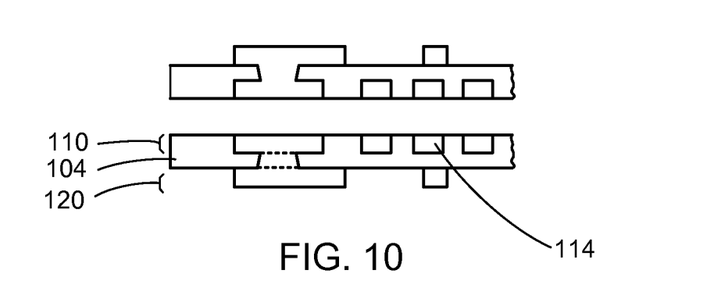
FIG. 10 is the structure of FIG. 9 in a separation phase.

Referring now to FIG. 10, therein is shown the structure of FIG. 9 in a separation phase. The separation phase can include removal of the carrier 302 of FIG. 3 to form two symmetrical parts.

The carrier 302 can be removed in a variety of ways. For example, the carrier 302 can be removed by sawing, cutting, etching, or a combination thereof. In an illustrative example, the carrier 302 can be removed by cutting the carrier 302 with a mechanical blade. In another illustrative example, the carrier 302 can be removed by etching with a solvent with a selectivity for the material of the carrier 302.

Removing the carrier 302 allows the separation of two units each having the insulation layer 104, the first metal layer 110, and the second metal layer 120. Removing the carrier 302 can expose a portion of the insulation layer 104 and a portion of the first metal layer 110.

The first metal layer 110 includes the first redistribution layer 114 having individual traces supported by the insulation material of the insulation layer 104. For example, the first redistribution layer 114 can include thin electrically conductive traces that are mechanically supported by the PPG material of the insulation layer 104.

Figure 11:
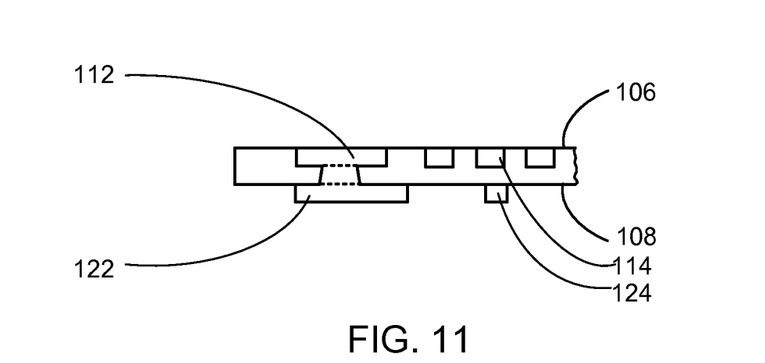
FIG. 11 is the structure of FIG. 10 in an etching phase.

Referring now to FIG. 11, therein is shown the structure of FIG. 10 in an etching phase. The etching phase can include cleaning the insulation layer component side 106 and the insulation layer system side 108 to remove unwanted material, such as flashing, residue, or a combination thereof.

The etching phase can remove unwanted material from the component attachment pads 112, the first redistribution layer 114, the system attachment pads 122, and the second redistribution layer 124. For example, the etching phase can remove reside from the top intermediate layer 314 of FIG. 3 and the bottom intermediate layer 316 of FIG. 3 left after the removal of the carrier 302 of FIG. 3 during the separation phase.

It has been discovered that etching the component attachment pads 112, the first redistribution layer 114, the system attachment pads 122, and the second redistribution layer 124 after removing the carrier 302 can increase performance and reduce errors by forming clean electrically conductive surfaces. Etching away unwanted insulation layer and carrier residue can reduce the likelihood of blockages that could prevent good electrical connections.

Figure 12:
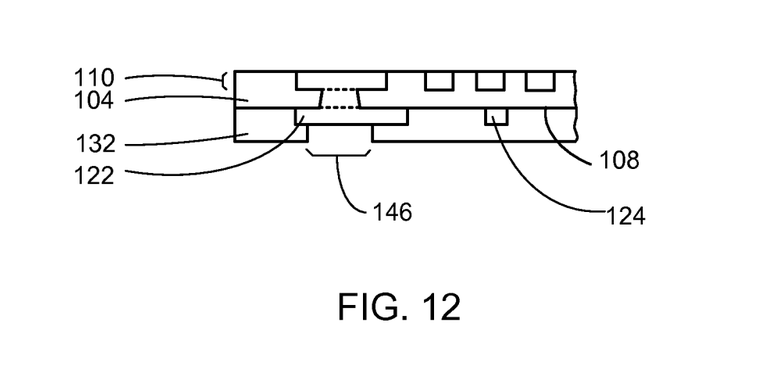
FIG. 12 is the structure of FIG. 11 in a protection phase.

Referring now to FIG. 12, therein is shown the structure of FIG. 11 in a protection phase. The protection phase can include forming the protective layer 132 on the insulation layer 104 and forming the external openings 146 exposing the system attachment pads 122.

The protective layer 132 can be formed directly on the insulation layer 104, the system attachment pads 122, and the second redistribution layer 124. The protective layer 132 can completely encapsulate the second redistribution layer 124. The protective layer 132 can be formed by applying the protective layer material, such as solder resist, directly on the insulation layer system side 108. The protective layer 132 is formed on the side of the insulation layer 104 opposite the first metal layer 110.

The external openings 146 can be formed in the protective layer 132 to expose portions of the system attachment pads 122. The external openings 146 can be formed in a variety of ways. For example, the external openings 146 can be formed by drilling, cutting, etching, or a combination thereof. In another example, the protective layer 132 can be formed directly on the insulation layer 104 in a pattern that includes the external openings 146. The external openings 146 can have the characteristics of being formed by drilling, cutting, or etching including scratches, burn marks, etching residue, burrs, or a combination thereof.

It has been discovered that forming the protective layer 132 directly on the insulation layer 104 provides increased reliability and reduced warpage. Providing the insulation layer 104 as the foundation base for forming the protective layer 132 allows the formation of the protective layer 132 conformal to the insulation layer 104, the system attachment pads 122, and the second redistribution layer 124 to increase the level of adhesion between the protective layer 132 and the insulation layer 104 providing a reliable connection.

Figure 13:
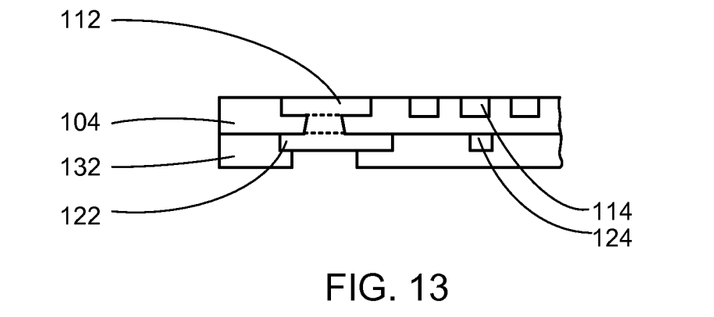
FIG. 13 is the structure of FIG. 12 in a routing phase.

Referring now to FIG. 13, therein is shown the structure of FIG. 12 in a routing phase. The routing phase can include cutting the insulation layer 104 and the protective layer 132 down from panel size to the strip size used for assembly of the integrated circuit packaging system 100 of FIG. 1. The routing phase can avoid cutting the first redistribution layer 114, the component attachment pads 112, the system attachment pads 122, the second redistribution layer 124, or a combination thereof.

The routing phase can form the integrated circuit packaging system 100 into a variety of form factors. For example, the integrated circuit packaging system 100 can be cut from the panel size can of 510 millimeters (mm) by 415 mm to the strip size of 74 mm by 240 mm.

The insulation layer 104 and the protective layer 132 can be cut in a variety of ways including by using a blade, saw, laser cutter, router, etching, or a combination thereof. The insulation layer 104 and the protective layer 132 layer can have the characteristics of a cut surface as a result of the routing phase including scratches, saw marks, burrs, erosion marks, burn marks, etching marks, or a combination thereof.

Figure 14:
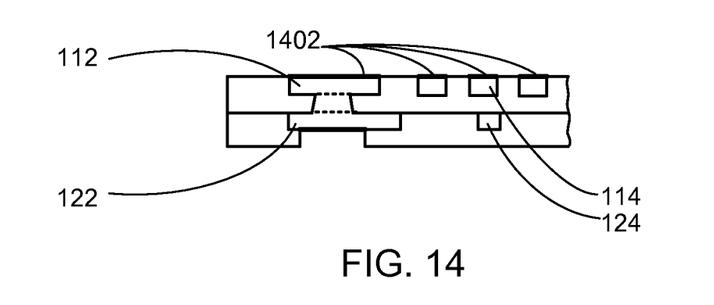
FIG. 14 is the structure of FIG. 13 in a preservation phase.

Referring now to FIG. 14, therein is shown the structure of FIG. 13 in a preservation phase. The preservation phase can include forming a preservation layer 1402 on the exposed surfaces of the component attachment pads 112, the first redistribution layer 114, the system attachment pads 122, the second redistribution layer 124, or a combination thereof. The preservation layer, such as an organic solderability preservative, can be used to protect an electrically conductive surface to provide an improved solder connection.

Figure 15:
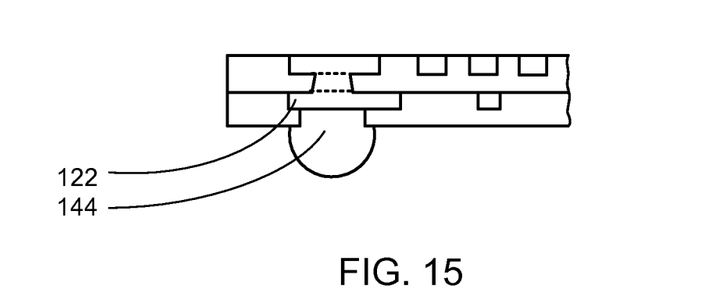
FIG. 15 is the structure of FIG. 14 in a connection phase.

Referring now to FIG. 15, therein is shown the structure of FIG. 14 in a connection phase. The connection phase can include attaching the external interconnects 144 on the system attachment pads 122 in the external openings 146 of FIG. 1.

The external interconnects 144 can be attached directly on the system attachment pads 122 to form an electrical connection with an external system (not shown). The external interconnects 144 can include solder balls, solder bumps, solder posts, bond wires, leads, or a combination thereof.

In an illustrative example, the external interconnects 144 can be formed directly in the external openings 146 and directly on the system attachment pads 122. In another illustrative example, the external interconnects 144 can be formed on an external system (not shown) and inserted into the external openings 146 to connect to the system attachment pads 122 during a reflow operation. The external openings 146 in the protective layer 132 of FIG. 1 are for exposing the system attachment pads 122 to allow the external interconnects 144 to be directly on the system attachment pads 122.

The external interconnects 144 can be directly on the surface of the external openings 146. The external interconnects 144 can conformally fill the external openings. For example, the external interconnects 144 can be solder balls that have been reflowed to be directly on the system attachment pads 122 and the surface of the external openings 146.

Figure 16:
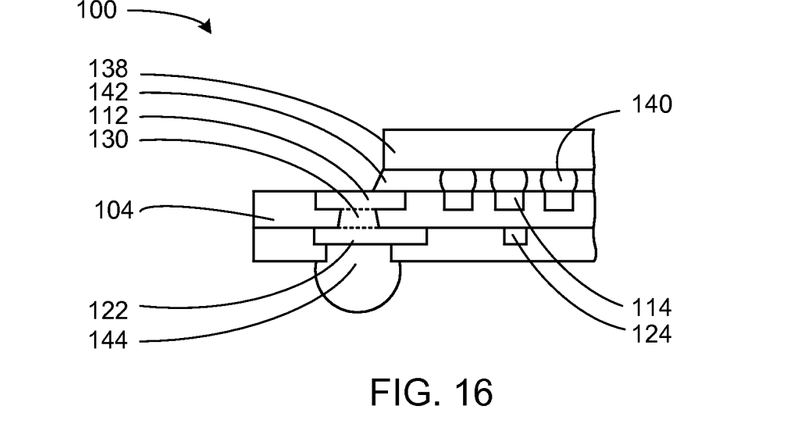
FIG. 16 is the structure of FIG. 15 in a mounting phase.

Referring now to FIG. 16, therein is shown the structure of FIG. 15 in a mounting phase. The mounting phase can include mounting the integrated circuit 138 over the insulation layer 104.

The integrated circuit 138 can be mounted over the die interconnects 140, the insulation layer 104, the component attachment pads 112, and the first redistribution layer 114. The integrated circuit 138 can be connected to the first redistribution layer 114 with the die interconnects 140. The integrated circuit 138 can form electrical connections to the external systems (not shown) via the die interconnects 140, the first redistribution layer 114, the component attachment pads 112, the vertical interconnects 130, the system attachment pads 122, the second redistribution layer 124, the external interconnects 144, or a combination thereof.

The integrated circuit packaging system 100 can include the adhesive layer 142 formed between the integrated circuit 138 and the insulation layer 104. The adhesive layer 142, such as an underfill layer, can be formed directly on the integrated circuit 138, the die interconnects 140, the component attachment pads 112, and the insulation layer 104. The adhesive layer 142 can be used to mechanically couple the integrated circuit 138 to the insulation layer 104.

It has been discovered that coupling the integrated circuit 138 to the insulation layer 104 with the adhesive layer 142 can provide improved reliability and reduced warpage. Using the adhesive layer 142 to couple the integrated circuit 138 to the insulation layer 104 can provide a strong mechanical bond and reduce the possibility of detachment.

Figure 17:
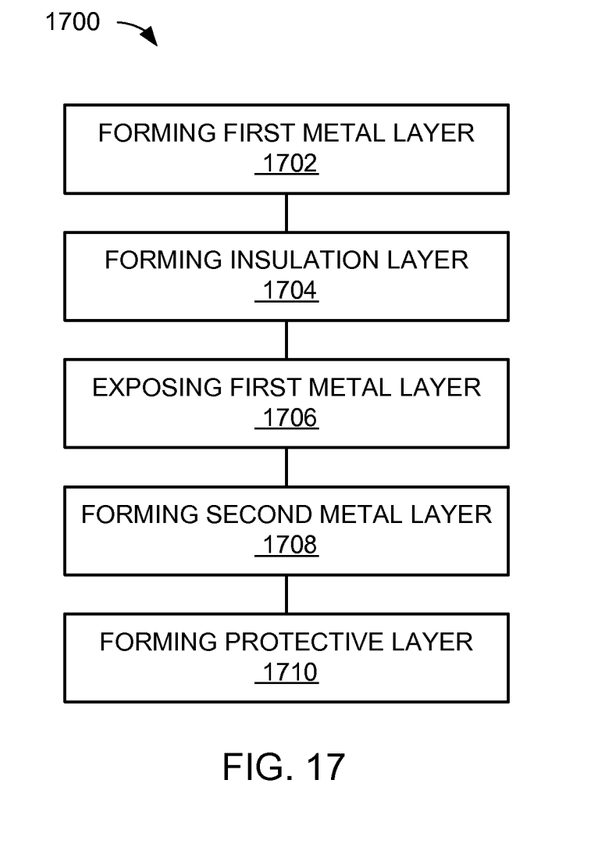
FIG. 17 is a flow chart of a method of manufacture of the integrated circuit packaging system of FIG. 1 in a further embodiment of the present invention.

Referring now to FIG. 17, therein is shown a flow chart of a method 1700 of manufacture of the integrated circuit packaging system 100 of FIG. 1 in a further embodiment of the present invention. The method 1700 includes: forming a first metal layer on a carrier in a block 1702; forming an insulation layer directly on the first metal layer in a block 1704; exposing a portion of the first metal layer for directly attaching to a die interconnect connecting to an integrated circuit in a block 1706; forming a second metal layer directly on the insulation layer opposite the side of the insulation layer exposed by removing the carrier in a block 1708; and forming a protective layer directly on the insulation layer and the second metal layer, the protective layer exposing a portion of the second metal layer for directly attaching an external interconnect in a block 1710.

Thus, it has been discovered that the integrated circuit packaging system of the present invention furnishes important and heretofore unknown and unavailable solutions, capabilities, and functional aspects for an integrated circuit packaging system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:

forming a first metal layer on a carrier, the first metal layer having a component attachment pad and a first redistribution layer;

forming an insulation layer directly on the first metal layer, the insulation layer formed from a fiber fabric pre-impregnated with resin (PPG) material;

exposing a portion of the first metal layer and a portion of the insulation layer by removing the carrier, the exposed portion of the component attachment pad and the first redistribution layer facing away from the insulation layer and coplanar with a component side of the insulation layer, and the exposed portion of the first meal layer for directly attaching to a die interconnect connecting to an integrated circuit;

forming a second metal layer directly on the insulation layer opposite the side of the insulation layer exposed by removing the carrier, the second metal layer having a vertical interconnect within a vertical opening in the insulation layer, and the vertical interconnect directly on the first metal carrier; and forming a protective layer directly on the insulation layer and the second metal layer, the PPG material of the insulation layer and the second metal layer forming a mold lock with the protective layer for resisting delamination, and the protective layer exposing a portion of the second metal layer for directly attaching an external interconnect.

2. The method as claimed in claim 1 wherein forming the insulation layer includes removing a portion of the insulation layer from the first metal layer, the first metal layer having the characteristics of the insulation layer removed.

3. The method as claimed in claim 1 wherein forming the protective layer includes forming the protective layer from a solder resist material.

4. The method as claimed in claim 1 wherein forming the second meal layer includes forming the vertical interconnect between a portion of the first metal layer and a portion of the second metal layer.

5. The method as claimed in claim 1 wherein forming the protective layer includes forming the protective layer between a portion of the second metal layer and another portion of the second metal layer.

6. A method of manufacture of an integrated circuit packaging system comprising:
   forming a first metal layer having a component attachment pad and a first redistribution layer directly on a carrier;
   forming an insulation layer directly on the component attachment pad and the first redistribution layer, the insulation layer formed from a fiber fabric pre-impregnated with resin (PPG) material, and
   exposing a portion of the component attachment pad, a portion of the first redistribution layer, and a portion of the insulation layer by removing the carrier, the exposed portion of the component attachment pad and the exposed portion of the first redistribution layer facing away from the insulation layer and coplanar with the exposed side of the insulation layer, and the exposed portion of the component attachment pad and the exposed portion of the first redistribution layer for directly attaching to a die interconnect connecting to an integrated circuit;
   forming a second metal layer having a system attachment pad and a second redistribution layer directly on the insulation layer and opposite the side of the insulation layer exposed by removing the carrier, the second metal layer having a vertical interconnect within a vertical opening in the insulation layer, and the vertical interconnect directly on the first metal carrier; and
   forming a protective layer directly on the insulation layer, the system attachment pad, and the second redistribution layer, the PPG material of the insulation layer and the second metal layer forming a mold lock with the protective layer for resisting delamination, and the protective layer exposing a portion of the system attachment pad for directly attaching an external interconnect.

7. The method as claimed in claim 6 wherein forming the insulation layer includes removing a portion of the insulation layer from the component attachment pad, the component attachment pad having the characteristics of the insulation layer removed.

8. The method as claimed in claim 6 wherein forming the protective layer includes forming the protective layer from a solder resist material.

9. The method as claimed in claim 6 wherein forming the second meal layer includes forming the vertical interconnect between a portion of the first metal layer and a portion of the second metal layer.

10. The method as claimed in claim 6 wherein forming the protective layer includes forming the protective layer between a portion of the second redistribution layer and another portion of the second redistribution layer.

11. An integrated circuit packaging system comprising:
    a first metal layer having a component attachment pad and a first redistribution layer for directly attaching to a die interconnect;
    an insulation layer directly on the first metal layer with a portion of the component attachment pad and a portion of the first redistribution layer exposed and coplanar with a component side of the insulation layer, the insulation layer formed from a fiber fabric pre-impregnated with resin (PPG) material, and an exposed side of the first metal layer facing away from the insulation layer;
    a second metal layer directly on the insulation layer and opposite the exposed side of the first metal layer, the second metal layer having a vertical interconnect within a vertical opening in the insulation layer, and the vertical interconnect directly on the first metal layer; and
    a protective layer directly on the insulation layer and the second metal layer, the PPG material of the insulation layer and the second metal layer forming a mold lock with the protective layer for resisting delamination, and the protective layer exposing a portion of the second metal layer for directly attaching to an external interconnect.

12. The system as claimed in claim 11 wherein the first metal layer has the characteristics of the insulation layer removed.

13. The system as claimed in claim 11 wherein the protective layer is a solder resist material.

14. The system as claimed in claim 11 wherein the vertical interconnect is between a portion of the first metal layer and a portion of the second metal layer.

15. The system as claimed in claim 11 wherein the protective layer is between a portion of the second metal layer and another portion of the second metal layer.

16. The system as claimed in claim 11 wherein:
    the insulation layer is directly on the component attachment pad and the first redistribution layer;
    the second metal layer includes a system attachment pad and a second redistribution layer directly on the insulation layer; and
    the protective layer is directly on the system attachment pad and the second redistribution layer, the protective layer exposing a portion of the system attachment pad for directly attaching to the external interconnect.

17. The system as claimed in claim 16 wherein the component attachment pad has the characteristics of the insulation layer removed.

18. The system as claimed in claim 16 wherein the protective layer is a solder resist material.

19. The system as claimed in claim 16 wherein the vertical interconnect forms an electrical connection between a portion of the first metal layer and a portion of the second metal layer.

20. The system as claimed in claim 16 wherein the protective layer is between a portion of the second redistribution layer and another portion of the second redistribution layer.

* * * * *